(12) United States Patent
Johal et al.

(10) Patent No.: US 7,710,776 B2
(45) Date of Patent: May 4, 2010

(54) METHOD FOR ON CHIP SENSING OF SONOS $V_T$ WINDOW IN NON-VOLATILE STATIC RANDOM ACCESS MEMORY

(75) Inventors: Jaskarn Johal, Colorado Springs, CO (US); Daryl Dietrich, Woodland Park, CO (US); John Roger Gill, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 11/647,017

(22) Filed: Dec. 27, 2006

(65) Prior Publication Data

US 2008/0158981 A1      Jul. 3, 2008

(51) Int. Cl.
    *G11C 14/00*    (2006.01)
(52) U.S. Cl. .............................. 365/185.08; 365/185.26; 365/185.24; 365/185.3; 365/185.29
(58) Field of Classification Search ............ 365/185.08, 365/185.29, 185.3, 185.24, 185.26
See application file for complete search history.

(56) References Cited

U.S. PATENT DOCUMENTS

| | | | |
|---|---|---|---|
| 4,095,281 A | 6/1978 | Denes | |
| 4,342,101 A | 7/1982 | Edwards | |
| 4,354,255 A | 10/1982 | Stewart | |
| 4,435,786 A | 3/1984 | Tickle | |
| 4,510,584 A | 4/1985 | Dias et al. | |
| 4,538,246 A | 8/1985 | Wang et al. | |
| 4,638,465 A | 1/1987 | Rosini et al. | |
| 5,327,385 A | 7/1994 | Oyama | |
| 5,353,248 A | 10/1994 | Gupta | |
| 5,365,475 A | 11/1994 | Matsumura et al. | |
| 5,477,485 A | 12/1995 | Bergemont et al. | |
| 5,523,971 A | 6/1996 | Rao | |
| 5,586,073 A | 12/1996 | Hiura et al. | |
| 5,648,930 A | 7/1997 | Randazzo | |
| 5,677,866 A | 10/1997 | Kinoshita | |
| 5,774,397 A | 6/1998 | Endoh et al. | |
| 5,774,400 A | 6/1998 | Lancaster et al. | |
| 5,828,599 A | 10/1998 | Herdt | |
| 5,914,895 A * | 6/1999 | Jenne ..................... | 365/185.08 |
| 5,986,932 A * | 11/1999 | Ratnakumar et al. ... | 365/185.07 |

(Continued)

FOREIGN PATENT DOCUMENTS

WO    WO 94/10686 A1    5/1994

OTHER PUBLICATIONS

Simtek, nvSRAM Basics, www.simtek.com/attachments/AppNote01.pdf.

(Continued)

*Primary Examiner*—Thong Q Le

(57) ABSTRACT

A system and method for determining a SONOS $V_T$ window using a current sensing scheme is disclosed. The present invention creates a first current path and a second current path through the volatile and non-volatile sections of an nvSRAM memory cell. The erase threshold voltage of the first edge of the window is determined when current is detected in the first path. The program voltage of the second edge of the window is determined when current is detected in the second path. Accordingly, the voltage used to power a plurality of SONOS transistors may be set using the values of the first and second threshold edges to determine the $V_T$ window.

7 Claims, 8 Drawing Sheets

U.S. PATENT DOCUMENTS

| | | | |
|---|---|---|---|
| 7,085,170 | B2 | 8/2006 | Mihnea et al. |
| 7,088,615 | B2* | 8/2006 | Guterman et al. ...... 365/185.03 |
| 7,110,293 | B2* | 9/2006 | Jung ...................... 365/185.08 |
| 7,355,897 | B2 | 4/2008 | Hsu et al. |
| 2005/0114266 | A1* | 5/2005 | Satkunanathan et al. ...... 705/59 |
| 2005/0162896 | A1* | 7/2005 | Jung .......................... 365/154 |
| 2008/0043516 | A1* | 2/2008 | Dalton ........................ 365/154 |

OTHER PUBLICATIONS van Schaijk et al., "Reliablility of embedded SONOS memories," Philips Research Leuven; 16 pages.

Erwin J. Prinz, "The Zen of Nonvolatile Memories," Freescale Semiconductor, Inc.; 6 pages.

Lee et al., "Scalable 2-bit silicon-oxide-nitride-oxide-silicon (SONOS) memory with physically separated local nitrides under a merged gate," Solid-State Electronics, 2004, <www.sciencedirect.com>; pp. 1771-1775; 5 pages.

Sadd et al., "Validation of a Predictive SONOS Model," Embedded Memory Center, Motorola; 2 pages.

Scade et al., "1MnvSRAM: a sophisticate SoC Solution as a Challenge for Design Architecture, Wafer Process and Design Verification," 6 pages.

Simtek, "QuantumTrap nvSRAM Technology," 1999 Simtek Corporation; 5 pages.

"SONOS Basic Mechanisms," "SONOS Endurance Cycling Effects," (Slide 6 and 9 from power point presentation), Northrop Grumman, Electronic Sensors and Systems Sector Advanced Technology Center, SONOS-2000.PPT, dated Nov. 15, 2001; 2 pages.

Jaskarn Johal, "On chip sensing of SONOS VT window for use with Smart recall," Simtek Corporation 2005, May 25, 2006; 5 pages.

SIMTEK, "STK14CA8: 128K x 8 AutoStore nvSRAM, QuantumTrap CMOS, Nonvolatile Static RAM," Mar. 2006, Document Control #ML0022 rev. 1.4; 18 pages.

USPTO Notice of Allowance for U.S. Appl. No. 11/644,196 dated Jan. 30, 2008; 7 pages.

U.S. Appl. No. 11/644,196: "Non-Volatile, Static Random Access Memory with Regulated Erase Saturation and Program Window," David Dalton, filed on Dec. 22, 2006; 45 pages.

USPTO Notice of Allowance for U.S. Appl. No. 08/926,611 dated Dec. 14, 1998: 3 pages.

USPTO Non-Final Rejection for U.S. Appl. No. 08/926,611 dated Jul. 7, 1998; 5 pages.

Betty Price, "Semiconductor Memories: A Handbook of Design, Manufacture and Application," Second Edition, Texas Instruments, John Wiley & Sons, 1983, pp. 611-620; 11 pages.

Herdt et al., "A 256K Nonvolatile Static RAM," Simtek Corporation, No. 5.3, 1995, pp. 1-4; 4 pages.

Ohnakado et al., "Novel Electron Injection Method Using Band-to-Band Tunneling Induced Hot Electron (BBHE) for Flash Memory with a P-Channel Cell," IEDM 95-279, 1995, pp. 11.5.1-11.5.4; 4 pages.

USPTO Notice of Allowance for U.S. Appl. No. 08/772,970 dated Oct. 15, 1997; 2 pages.

USPTO Non-Final Rejection for U.S. Appl. No. 08/772,970 dated Jun. 11, 1997; 4 pages.

USPTO Requirement for Restriction/Election for U.S. Appl. No. 08/772,970 dated Apr. 23, 1997; 3 pages.

Miyawaki et al., "A New Erasing and Row Decoding Scheme for Low Supply Voltage Operation 16-Mb/64-Mb Flash Memories," IEEE Journal of Solid-State Circuits, vol. 27, No. 4, Apr. 1992, pp. 583-588; 6 pages.

Momodomi et al., "An Experimental 4-Mbit CMOS EEPROM with a NAND-Structured Cell," IEEE Journal of Solid-State Circuits, vol. 24, No. 5, Oct. 1989, pp. 1238-1243; 6 pages.

Lundstrom et al., "Properties of MNOS Structures," IEEE Journal of Solid-State Circuits, vol. ED-19, No. 6, Jun. 1972, pp, 826-836; 11 pages.

Nozaki et al., "A -1Mb EEPROM with MONOS Memory Cell for Semiconductor Disk Application," IEEE Journal of Solid-State Circuits, vol. 26, No. 4, Apr. 1991, pp. 497-501; 5 pages.

Suzuki et al., "A Low Voltage Alterable EEPROM with Metal-Oxide-Nitride-Oxide Semiconductor (MONOS) Structures," IEEE Journal of Solid-State Circuits, vol, ED-30, No. 2, Feb. 1983; 7 pages.

Svensson et al., "Trap-Assisted Charge Injection in MNOS Structures," Journal of Applied Physics, vol. 44, No. 10, Oct. 1973, pp. 4657-4663; 7 pages.

S.M. Sze, "Physics of Semiconductor Devices," Wiley-Interscience, 1969. SBN: 471842907, pp. 425-437; 9 pages.

USPTO Notice of Allowance for U.S. Appl. No. 08/885,156 dated Dec. 16, 1998; 1 page.

USPTO Non-Final Rejection for U.S. Appl. No. 08/885,156 dated Aug. 27, 1998; 3 pages.

* cited by examiner

METHOD FOR ON CHIP SENSING OF SONOS $V_T$ WINDOW IN NON-VOLATILE STATIC RANDOM ACCESS MEMORY

BACKGROUND OF THE INVENTION

1. Field of the Invention

The present invention is generally directed to memory, and more particularly to on chip sensing of a SONOS $V_T$ window in a non-volatile Static Random Access Memory (nvSRAM).

2. The Relevant Technology

Semiconductor memory devices are widely used in the computer and electronics industries as a means for retaining digital information. A typical semiconductor memory device is comprised of a large number of memory elements, known as memory cells, that are each capable of storing a single digital bit. The memory cells are arranged into a plurality of separately addressable memory locations, each being capable of storing a predetermined number of digital data bits. All of the memory cells in the device are generally located upon a single semiconductor chip which is contacted and packaged for easy insertion into a computer system.

Margin mode testing, where a threshold voltage range is measured for silicon oxide nitride oxide semiconductor (SONOS) transistors in a nonvolatile memory portion by performing a series of recall operations using varying bias levels, is currently used to determine the store/erase voltage, $V_{SE}$, for a RECALL operation on a non-volatile Static Random Access Memory (nvSRAM) cell. A margin mode process begins by storing data into the non-volatile SRAM cell. Then, the opposite data is then written into the Static Random Access Memory (SRAM) cell. $V_{SE}$ is set to a static value of 0V. The stored data is then recalled and the entire contents of the SRAM is read to check if the recall operation was successful. Typically, once the threshold voltage range is determined and $V_{SE}$ is set, it is not altered. If a $V_{SE}$ for a RECALL operation is chosen based on the $V_T$ window, it may be that the $V_{SE}$ falls outside of that range due to degradation of the program and erase threshold voltages of the SONOS transistors.

It would therefore be advantageous to provide a method and apparatus for determining the threshold voltage range for the SONOS transistors without having to perform an endless number of tests that are both time consuming and unable to adapt to the degradation of threshold voltages.

BRIEF SUMMARY OF THE INVENTION

The present invention provides a simple method to locate the $V_T$ program/$V_T$ erase ($V_{Tp}$/$V_{Te}$) window on a semiconductor memory chip in real time. The appropriate value of $V_{SE}$ is then set based upon the window—i.e., an adaptive recall scheme. In one arrangement, a method for using a current sensing scheme to determine a $V_T$ window for a SONOS transistor in a non-volatile SRAM is provided. The present invention creates a first current path and a second current path through the volatile and non-volatile sections of an nvSRAM memory cell. The erase threshold voltage of the first edge of the window is determined when current is detected in the first path. The program threshold voltage of the second edge of the window is determined when current is detected in the second path. Accordingly, the voltage used to power a plurality of SONOS transistors may be set using the values of the first and second threshold edges to determine the $V_T$ window.

In another configuration, the $V_T$ window is used to set the SONOS transistor voltage $V_{SE}$ for a RECALL operation in a nvSRAM device. A first current path is created from each erase tri-gate structure in the non-volatile portion to a first location. The erase tri-gate structure has a recall transistor, a store transistor and a SONOS transistor. The first current path includes a data node within said volatile portion. The first location has a current monitoring means for detecting current on the first current path. A second current path is created from each program tri-gate structure in the non-volatile portion to a second location. The program tri-gate structure has a recall transistor, a store transistor and a SONOS transistor. The second current path includes a data node within the volatile portion. The second location also has a current monitoring means for detecting current on the second current path.

A voltage is applied to the gate nodes of each SONOS transistor, ramping from an initial voltage to a terminating voltage. The current within the first current path is detected to determine the erase threshold voltage. A range of voltages is then determined where current in the first current path does not increase when the voltage applied to the SONOS transistors is continued to be ramped. Current within the second current path is detected to determine a program threshold voltage. The voltage $V_{SE}$ to apply to the gate nodes of the plurality of SONOS transistors within the range of voltages is chosen from the range where the current in the first current path does not increase.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be considered illustrative rather than limiting.

DETAILED DESCRIPTION OF THE PREFERRED EMBODIMENTS

A system and method for determining a $V_T$ window for a SONOS transistor in a non-volatile SRAM is disclosed. Once the $V_T$ window is determined, the recall $V_{SE}$ may be selected within the window to optimize the recall of data from the non-volatile portion of an nvSRAM.

Figure 1:
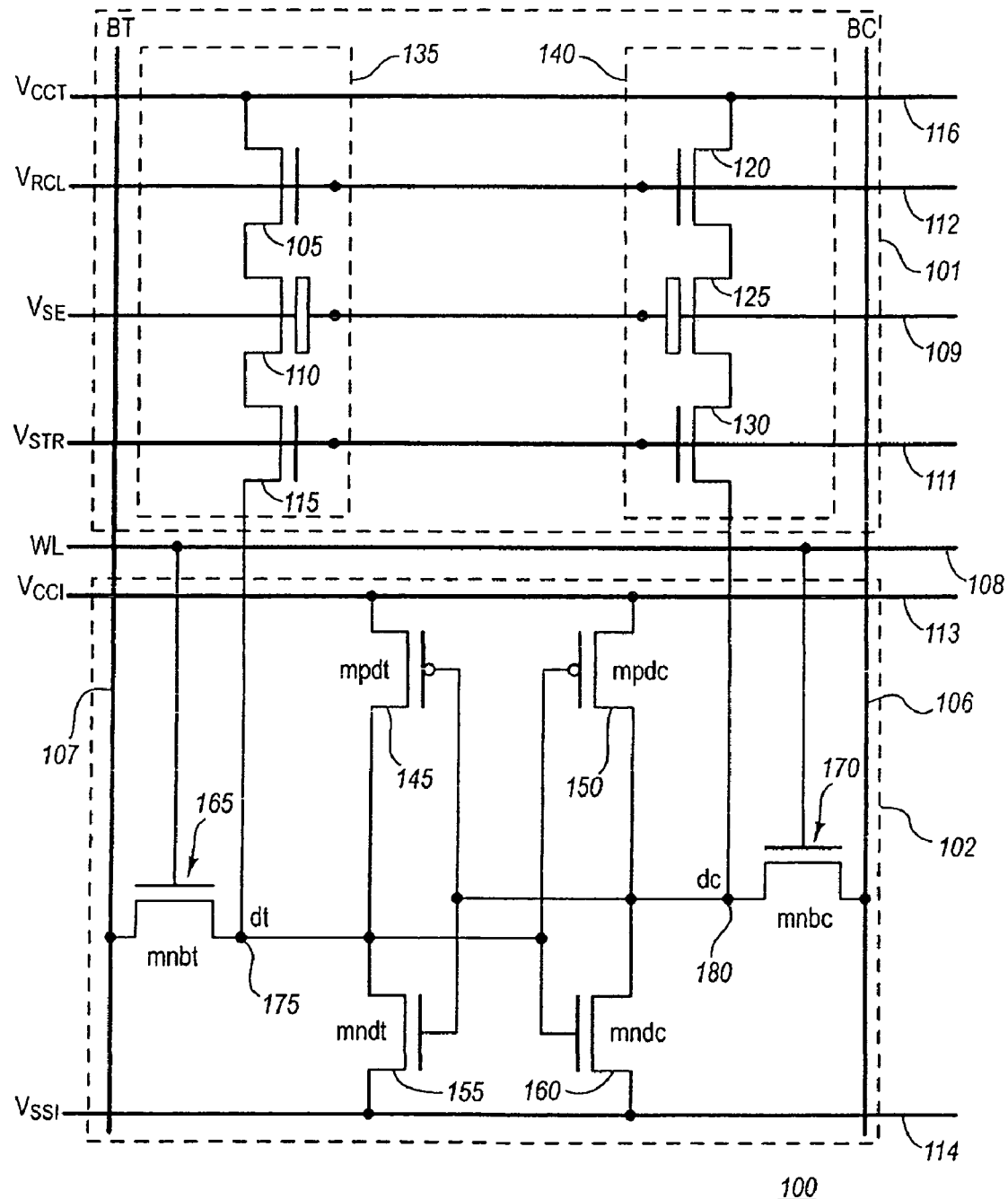
FIG. 1 is a schematic diagram illustrating an nvSRAM memory cell in accordance with one embodiment of the present invention.

FIG. 1 illustrates a typical nvSRAM cell 100 in accordance with the following invention. The nvSRAM cell has a volatile portion 102 and a nonvolatile portion 101. As will be described in more detail, a data bit stored in the volatile portion 102 can be transferred to the nonvolatile portion 101 by performing a store operation. Similarly, a data bit stored in the nonvolatile portion 101 can be transferred to the volatile portion 102 by performing a recall operation. If system power is removed and then replaced—e.g., when an associated computer system is turned off and then turned on again—a recall operation has to be performed to transfer the address information from the nonvolatile portion 101 to the volatile portion 102.

In the illustrated example, the volatile portion 102 is a six transistor Static Random Access Memory (SRAM) cell. The word static indicates that the memory retains its contents as long as power remains applied. Random access means that locations in the memory can be written to or read from in any order, regardless of the memory location that was accessed last.

SRAM cell 102 typically has three states: standby, reading and writing. In the standby state, the circuit is idle waiting for a read or a write operation. In operation, the word line WL is not asserted and so transistors 165, 170 disconnect the SRAM cell 102 from the bit lines BT 107 and BC 106. The first cross coupled inverter formed by transistors 145, 155 and the second cross coupled inverter formed by transistors 150, 160 continue to reinforce each other and the data remains unchanged.

In the read state, data within SRAM cell 102 is requested. Assume for purposes of explanation that the contents of the memory of SRAM cell 102 is a 1 stored at dt 175. The read cycles starts by pre-charging both the bit lines to a logical 1, then asserting the word line WL, thereby enabling both transistors 165, 170. The values stored in dt 175 and dc 180 are transferred to the bit lines BT 107 and BC 106 by leaving BC at its pre-charged value and discharging BT through transistor 165 and transistor 155 to a logical 0. On the BC side, transistor 150 and transistor 170 pull the bit line towards a $V_{CCP}$, a logical 1. If, however, the contents of the memory of SRAM cell 102 was a logic 1, the opposite would happen and BT would be pulled towards a logic 1 and BC towards a logic 0.

In the write state, the contents of SRAM cell 102 is updated. The write cycle begins by applying the value to be written to the bit lines BT 107 and BC 106. If a logic 0 is desired to be written, a 0 is applied to the bit lines by setting BT to 0 and BC to 1. A logic 1 is written by inverting the values of the bit lines BT 107 and BC 106. The word line WL is asserted and the value that is to be stored is latched in. The bit line input drivers are designed to be much stronger than the relatively weak transistors in the cell itself, so they can easily override the previous state of the cross-coupled inverters.

Each bit in an SRAM is stored on four transistors that form two cross-coupled inverters. The storage cell has two stable states, which are used to denote a 0 and a 1. Two additional transistors serve to control access to a storage cell during read and write operations. Accordingly, six transistors store one memory bit.

Access to each cell is enabled by the word line (WL) 108 that controls the two transistors 165, 170. Transistors 165, 170 control whether the cell should be connected to the bit lines BT 107 and BC 106. Transistors 165, 170 are also used to transfer data for both the read and write operations. Two bit lines BT and BC are not required, however, both the signal and the compliment of that signal are provided to improve noise margins.

Generally, as illustrated in FIG. 1, nvSRAM cell 100 comprises a plurality of n-channel, Field-Effect Transistors (FETs); a plurality of nonvolatile elements, such as nonvolatile transistors or capacitors; and a plurality of resistors. It should, however, be appreciated that other types of transistors, such as p-channel FETs, and combinations of different types of transistors can be utilized.

As shown specifically in FIG. 1, the volatile portion 102 includes a first SRAM FET mndt 155 and a second SRAM FET mndc 160 that are in a 1-bit latch configuration in which the drain of each FET is coupled to the gate of the other FET and the source of one FET is coupled to the source of the other FET. In the latch configuration, the first and second SRAM FETs 155, 160 operate as switches that are either in an ON state or an OFF state. More specifically, the latch operates so that when one of the first and second SRAM FETs 155, 160 is in an ON state the other is necessarily in an OFF state. This manner of operation permits the latch to differentially store a bit of data, which can have either a 0 state or 1 state. For example, if a bit of data is in a 0 state, the latch can represent the 0 state of the bit by placing the first SRAM FET mndt 155 in an ON state and the second SRAM FET mndc 160 in an OFF state. Conversely, if the bit of data is in a 1 state, the latch can represent the 1 state of the bit by placing the first SRAM FET mndt 155 in an OFF state and a second SRAM FET mndc 160 in an ON state.

The volatile portion 102 further includes first and second pull-up transistors mpdt 145 and mpdc 150 to aid the first and second SRAM FETs 155, 160 in latching a bit of data from the nonvolatile portion 101 or from an exterior environment. The gate of the first pull-up p-channel transistor mpdt 145 is coupled to the gate of the first SRAM FET rndt 155. The gate of transistor mpdt 145 is also connected to the drain of second SRAM FET mndc 160 and the source of second pull-up transistor mpdc 150. The source of the p-channel transistor mpdt 145 is coupled to the drain of the first SRAM FET mndt 155, which is identified as dt node 175. Similarly, the gate of the second pull-up p-channel transistor mpdc 150 is coupled to the gate of the second SRAM FET mndc 160. The gate of second pull-up transistor mpdc 150 is also coupled to the drain of first SRAM FET mndt 155 and the source of first pull-up transistor mpdt 145. The source of the p-channel transistor mpdc 150 is coupled to the drain of the second SRAM FET mndc 160. There are a number of alternatives to the use of pull-up p-channel transistors. For example, depletion n-channel FETs or pull-up resistors can be utilized.

Also included in the volatile portion 102 are first and second transfer or pass FETs 165, 170 for transferring a bit of data between the latch formed by the first and second SRAM FETs 155, 160 and the exterior environment. The gate of each of the first and second transfer FETs 165, 170 is connected to a word line. The drains of the first and second transfer FETs 165, 170 are respectively connected to nodes dt 175 and dc 180. The sources of the first and second transfer FETs 165, 170 are respectively connected to bit lines 107, 106. The first and second transfer FETs 165, 170 function as switches that are placed in an ON state to transfer a bit of data between the latch and the bit lines 107, 106 and otherwise placed in an OFF state. The state of the first and second transfer FETs 165, 170 (ON or OFF) is controlled by a signal applied to the word line.

The nonvolatile portion 101 includes a first silicon oxide nitride oxide semiconductor (SONOS) FET 110 and a second SONOS FET 125 for respectively storing the state of the first SRAM FET 155 and the second SRAM FET 160 in the volatile portion 102. The state of the first and second SRAM FETs 155, 160 is stored in the first and second SONOS FETs 110, 125 by forcing, in a store operation, the threshold voltages for turning ON the first and second SONOS FETs 110, 125 to reflect the states of the first and second SRAM FETs 155, 160. For example, if the first SRAM FET 155 is in an OFF state and the second SRAM FET 160 is in an ON state, the store operation would reflect this state of the first and second SRAM FETs 155, 160 by forcing the threshold voltage for turning ON the first SONOS FET 110 to be less than the threshold voltage for turning ON the second SONOS FET 125. This forcing is accomplished by appropriately cycling a $V_{SE}$ signal applied to the gates of SONOS FETs 110, 125. It should be appreciated that the SONOS FETs 110, 125 can be replaced with other types of nonvolatile storage elements, such as silicon nitride oxide semiconductor (SNOS) transistors, floating gate transistors, ferroelectric transistors, and capacitors to name a few.

The nonvolatile portion 101 further includes a first store FET 115 and a second store FET 130 that operate as switches during store and recall operations to appropriately configure the nonvolatile portion 101 for the transfer of a bit of data between the volatile portion 102 and the nonvolatile portion 101. More specifically, the first and second store FETs 115, 130 function to connect the nonvolatile portion 101 to the volatile portion 102 during store and recall operations and to otherwise disconnect the nonvolatile portion 101 from the volatile portion 102. The state of the first and second store FETs 115, 130 is controlled by a $V_{STR}$ signal that is applied to the gates of the FETs. More specifically, if the $V_{STR}$ signal is LOW, the first and second store FETs 115, 130 are turned OFF to disconnect the nonvolatile portion 101 from the volatile portion 102. Conversely, if the $V_{STR}$ signal is HIGH, the first and second store FETs 115, 130 are turned ON to connect the nonvolatile portion 101 to the volatile portion 102. Typically, a LOW signal is approximately 1.8V and a HIGH signal is approximately 3.3V.

The nonvolatile portion 101 further includes a first recall FET 105 and a second recall FET 120 that also function as switches to place the nonvolatile portion 101 in the appropriate configuration for transferring a bit of data between the volatile portion 102 and the nonvolatile portion 101 during store and recall operations. More specifically, the first and second recall FETs 105, 120 function to connect the nonvolatile portion 101 to $V_{CCT}$ during a recall operation and to disconnect the nonvolatile portion 101 from the $V_{CCT}$ during a store operation and otherwise. The state of the first and second recall FETs 105, 120 is controlled by a $V_{RCL}$ signal that is applied to the gates of the FETs. More specifically, if the $V_{RCL}$ signal is LOW, the first and second recall FETs 105, 120 are turned OFF to disconnect the nonvolatile portion 101 from $V_{CCT}$. Conversely, if the $V_{RCL}$ signal is HIGH, the first and second recall FETs 105, 120 are turned ON to connect the nonvolatile portion 101 to $V_{CCT}$. In a preferred embodiment of the present invention, the control signals on the $V_{RCL}$, $V_{SE}$, $V_{STR}$ and word lines WL are provided by a device control unit (not shown).

It should be appreciated that other nonvolatile configurations are possible to achieve the functions of the nonvolatile portion 101 of the cell 100 and the invention is in no way limited to the particular configuration illustrated in FIG. 1. The particular configuration utilized in any application will depend upon both technological and performance criteria.

During normal SRAM cell operation, node $V_{STR}$ is held low which disconnects the nonvolatile section 101 of the nvSRAM cell from the volatile section 102. In other words, there is typically no communication between volatile section 102 and nonvolatile section 101 of the memory cell 100. The volatile section 102 of memory cell 100 is accessed in the following manner. The word line, WL 108, is raised to approximately 1.8V to turn on the pass transistor gates 115, 130 and the data is read or written differentially through the bit lines, BT 107 and BC 106. The transfer of data from the volatile section 102 to the non-volatile section 101, i.e. a STORE operation, takes place in two steps, during which the word line, WL 108, is OFF or at 0V (i.e., ground).

During the first step, the erase portion of the STORE cycle, nonvolatile control lines $V_{STR}$ 111 and $V_{RCL}$ 112 remain low or OFF, which is typically 1.8V. Then, non-volatile transistor gate of SONOS transistors 110, 125 is pumped down to a negative supervoltage through node $V_{SE}$ 109 sufficient to positively charge the nitride dielectric through direct tunneling across the ultrathin tunnel oxide. In a typical arrangement, the negative supervoltage is approximately −10V. Node $V_{SE}$ 109 is held at the negative supervoltage long enough to convert all the threshold voltages, $V_T$, of all the nitride transistors in the array to equal depletion values. The erase portion of the STORE cycle is completed by discharging $V_{SE}$ back to ground.

For the second step, the program portion, assume for illustrative purposes that the last SRAM cycle left a HIGH data state on the data true node, dt 175, and a LOW on the data compliment node, dc 180 of the volatile section 102. Node $V_{STR}$ 111 is brought HIGH to approximately 3.3V and $V_{SE}$ 109 is pumped to a positive supervoltage. In a typical arrangement, the positive supervoltage applied to $V_{SE}$ 109 is approximately +10V. The transistor 130 gated by $V_{STR}$ 111 on the right side of the memory cell 100 is on, since its gate is HIGH and source is LOW, so the node defined by SONOS transistor 125 is held low. The entire supervoltage drops across the nitride dielectric, causing the dielectric to become negatively charged through direct tunneling of electrons from the channel into the nitride. The $V_T$ of nonvolatile transistor 125 therefore changes from depletion to enhancement.

On the left side of the memory cell 100, the pass transistor 115 gated by $V_{STR}$ 111 is off since both source and gate are at the same high voltage. The transistor is cut-off, the node defined by SONOS transistor 110 is isolated and the channel of the nonvolatile transistor couples up with the rising $V_{SE}$ voltage 111. There is thus essentially no voltage across the nitride dielectric, no tunneling takes place and the $V_T$ of SONOS transistor 110 remains unchanged. This side of the cell has been program inhibited. A differential threshold voltage that reflects the existing volatile section 102 data is now established in the cell 100.

The RECALL cycle begins by clearing the existing SRAM data, first by discharging the bit lines, BT 107 and BC 106, and then by turning on the word line, WL 108. The word line 108 is then returned to ground. Both nodes $V_{STR}$ and $V_{RCL}$ are turned on, providing a charging path to the internal nodes of the volatile section 102 through the nonvolatile section 101 to the power supply. With nonvolatile gate, $V_{SE}$, held at ground and assuming the preceding threshold voltages, the left-hand nonvolatile transistor 115 will conduct current while the right-hand transistor 125 will not. Node dt 175 charges up high, while node dc 180 remains low, thereby reestablishing the data corresponding to the last STORE cycle as explained above. The RECALL operation is completed by returning all control lines to their default states.

Figure 2:
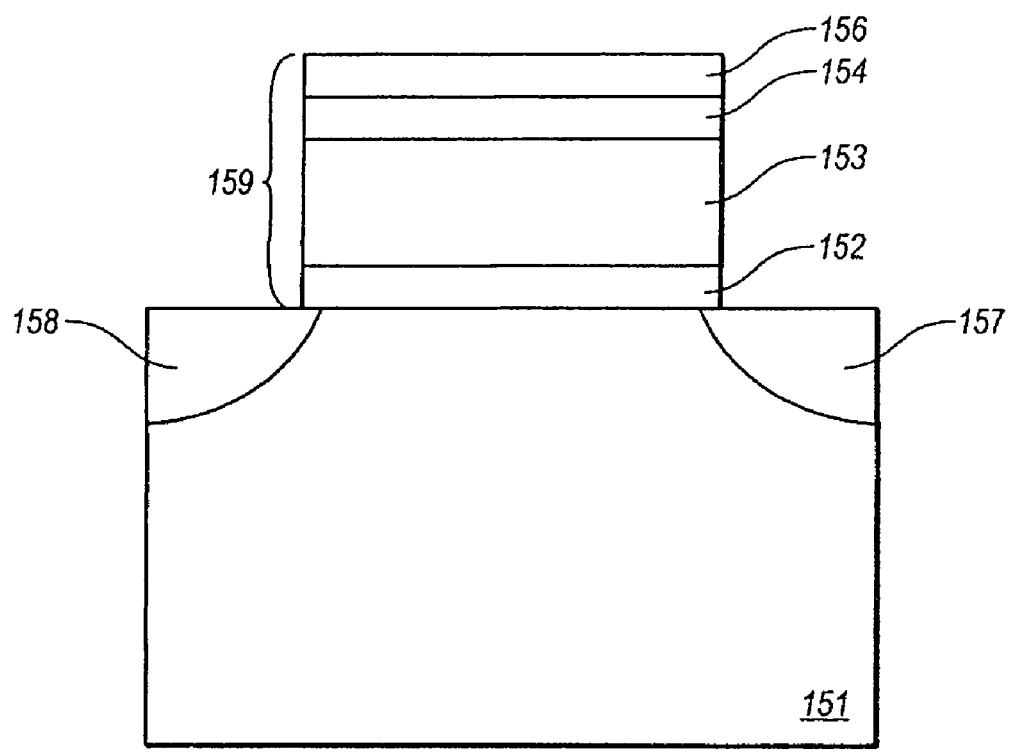
FIG. 2 illustrates a cross-sectional view of a SONOS transistor.

Embodiments of the present invention may be used with an SONOS memory cell structure of FIG. 2, which includes a transistor in an integrated circuit substrate 151, such as a silicon semiconductor substrate. The transistor includes a gate 159 having a charge trapping region 153 therein. More specifically, the transistor can comprise spaced apart source and drain regions 157 and 158, respectively, in the integrated circuit substrate 151 and the gate 159 on the integrated circuit substrate. The gate 159 comprises a tunnel insulating layer 152 on the substrate 151, the charge trapping region 153 on the tunnel insulating layer 152, a blocking insulating layer 154 on the charge trapping region 153, and a gate electrode 156 on the blocking insulating layer 154.

In the illustrated embodiment, the tunnel insulating layer 152 comprises oxide, the blocking insulating layer 154 comprises oxide, which may be the same as or different from the tunnel insulating layer, and the gate electrode 156 comprises conductive material. The charge trapping region 153 comprises a nitride. The blocking insulating layer 154 cuts off charges flowing into the charge trapping region 153 from the gate electrode 156 when operational voltages are applied to the gate electrode 156.

Referring again to FIG. 2, in order to program a memory cell according to some embodiments of the present invention, a voltage of 0V may be applied to the substrate 151, and a program voltage higher than 0V may be applied to the gate electrode 156. As a result, electrons in the channel tunnel through the tunnel insulating layer 152 to migrate to deep level traps in the charge trapping region 153. It will be understood that the program threshold voltage ($V_{Tp}$) is defined when charge is stored in the charge trapping region.

In an erasing operation, an erase voltage, which may be of uniform or non-uniform level, is applied to the gate 156 for a time interval that is sufficient to lower the threshold voltage of the transistor from the program threshold voltage $V_{Tp}$ to an erase threshold voltage $V_{Te}$ that is lower than the program threshold voltage $V_{Tp}$. In the erasing operation, at least some of the electrons in the charge trapping region 153 tunnel through the tunnel insulating layer 152 into the substrate 151 into a channel in the substrate 151 that is formed beneath the gate 159. Thus, the erase threshold voltage is defined when an erase voltage is applied to the gate 159 that is sufficient to discharge at least some of the charge that is stored in the charge trapping region 153.

Figure 2A:
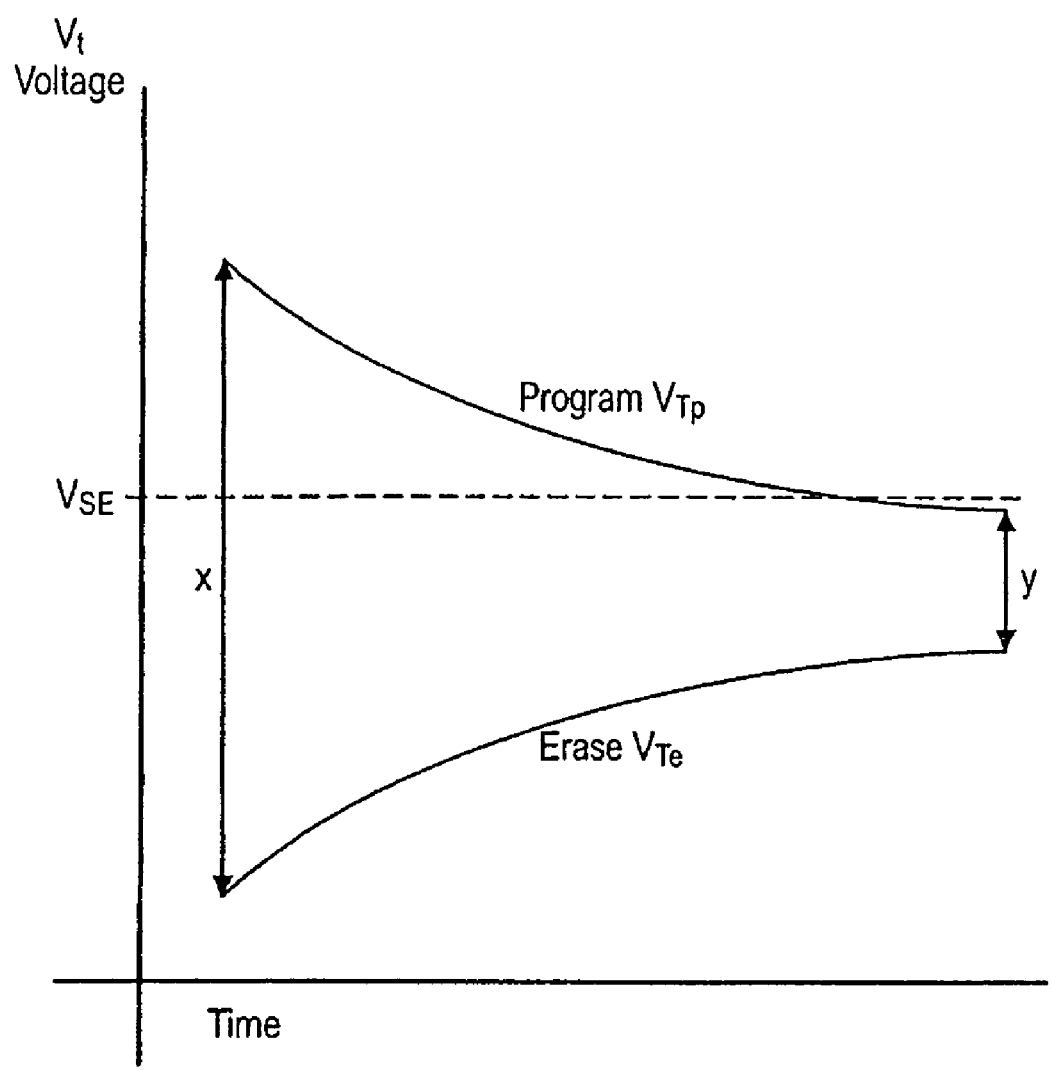
FIG. 2A illustrates a time vs. $V_{SE}$ curve showing the degradation of $V_{Tp}$ and $V_{Te}$ over time and the results in choosing a particular $V_{SE}$ within the initial $V_T$ window.

FIG. 2A illustrates a graph of the threshold voltage ($V_T$) for a SONOS transistor illustrated in FIG. 2, and its degradation over time. The top curve represents the program threshold voltage $V_{Tp}$ and the bottom curve represents the erase program voltage $V_{Te}$. As illustrated, early on in the life of the SONOS transistor, the $V_T$ window is defined as the difference between $V_{Tp}$ and $V_{Te}$, represented by the difference "x" in FIG. 2A. As time progresses, both the threshold voltages for programming and erasing, $V_{Tp}$ and $V_{Te}$ degrade and the $V_T$ window also decreases, as represented by the difference "y" in FIG. 2A.

For a RECALL operation as explained above, $V_{SE}$ is chosen to have a value within the $V_T$ window. As shown in FIG. 2A, if the value of $V_{SE}$ is selected when the window is "x," as degradation in the threshold voltages occurs and the window shrinks to "y," $V_{SE}$ is no longer within the $V_T$ window and the RECALL function fails. Therefore, having a $V_{SE}$ that fails to adapt to the change in the $V_T$ window is undesirable. Other things may cause a shift in the $V_T$ window such as process corners and data dependencies, temperature variations such as storing at cold and recalling at hot, poor store voltages and time dependencies to name a few.

Figure 3:
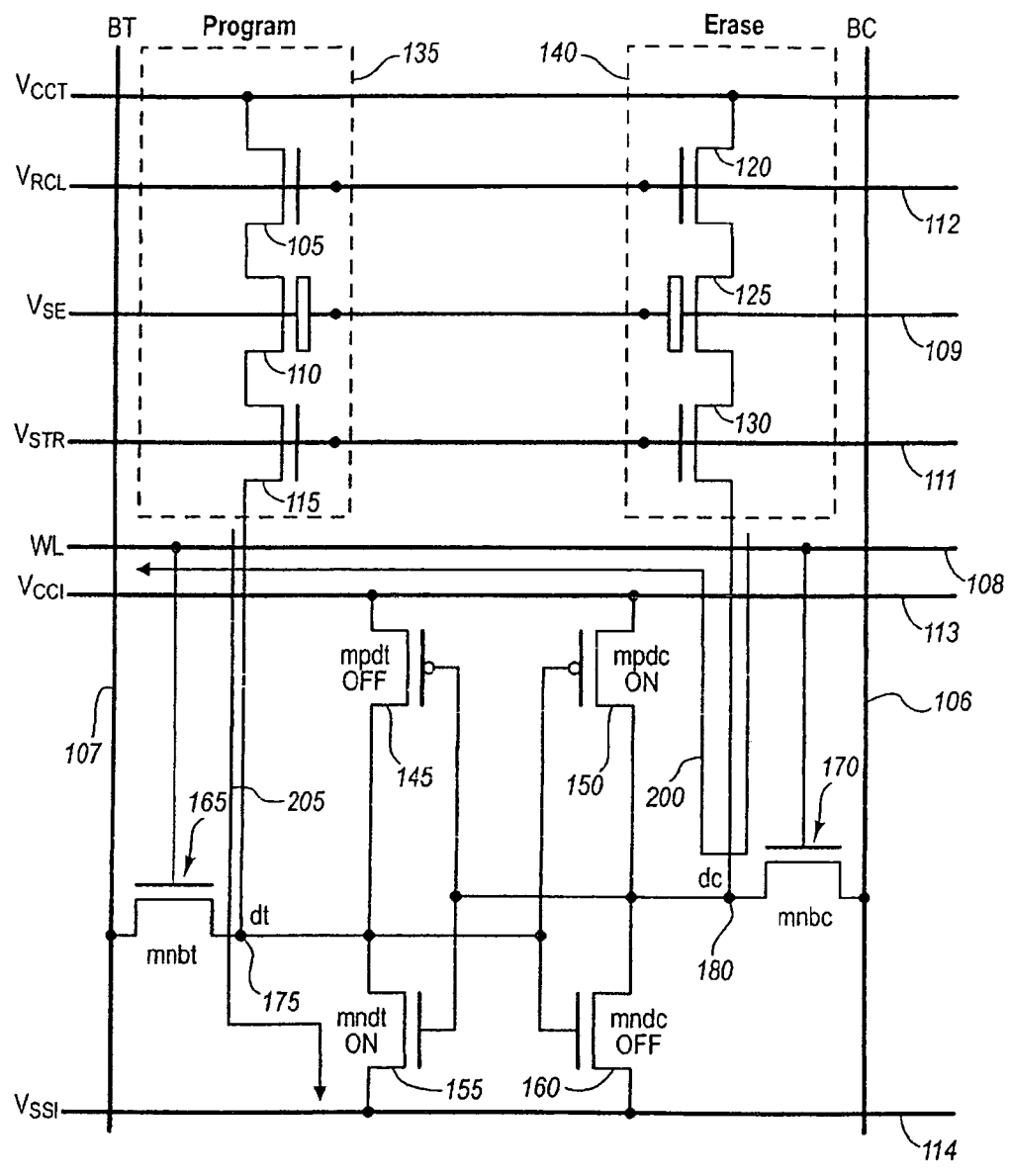
FIG. 3 is a schematic diagram illustrating two current paths for measuring the $V_T$ window for the SONOS transistors where the left portion is the Program side and the right portion is the ERASE side.

FIG. 3 illustrates the current sense scheme of the present invention for determining the $V_T$ of the SONOS transistors 110, 125 so as to determine the best $V_{SE}$ level to perform a successful RECALL function on a chip. As illustrated, the memory cell 100 is configured to allow current to flow from the two tri-gates 135, 140 through $V_{SSI}$ 114. $V_{RCL}$ and $V_{STR}$ are set HIGH or on, which in the illustrated embodiment is applying approximately 3.3V to $V_{RCL}$ and $V_{STR}$, which in turn applies the same voltage to the gates of transistors 105, 115, 120, 130. The word line WL 108 is set low to approximately 0V (i.e., ground) so as to turn off bit lines BT 107 and BC 106. For testing purposes, $V_{CCI}$ is initially floated and then shorted to $V_{SSI}$ using a clamp and the limit of the current flowing through $V_{SSI}$ is set. Current may also be limited through $V_{CCT}$ or both $V_{SSI}$ and $V_{CCT}$, so long as the total current flowing through the tri-gate structures is limited. For purposes of illustration and explanation, the combination of the tri-gate 140 connected to the dc node 180 will be referred to as the erase side and the combination of the tri-gate 135 connected to the dt node 175 will be referred to as the program side.

Figure 4:
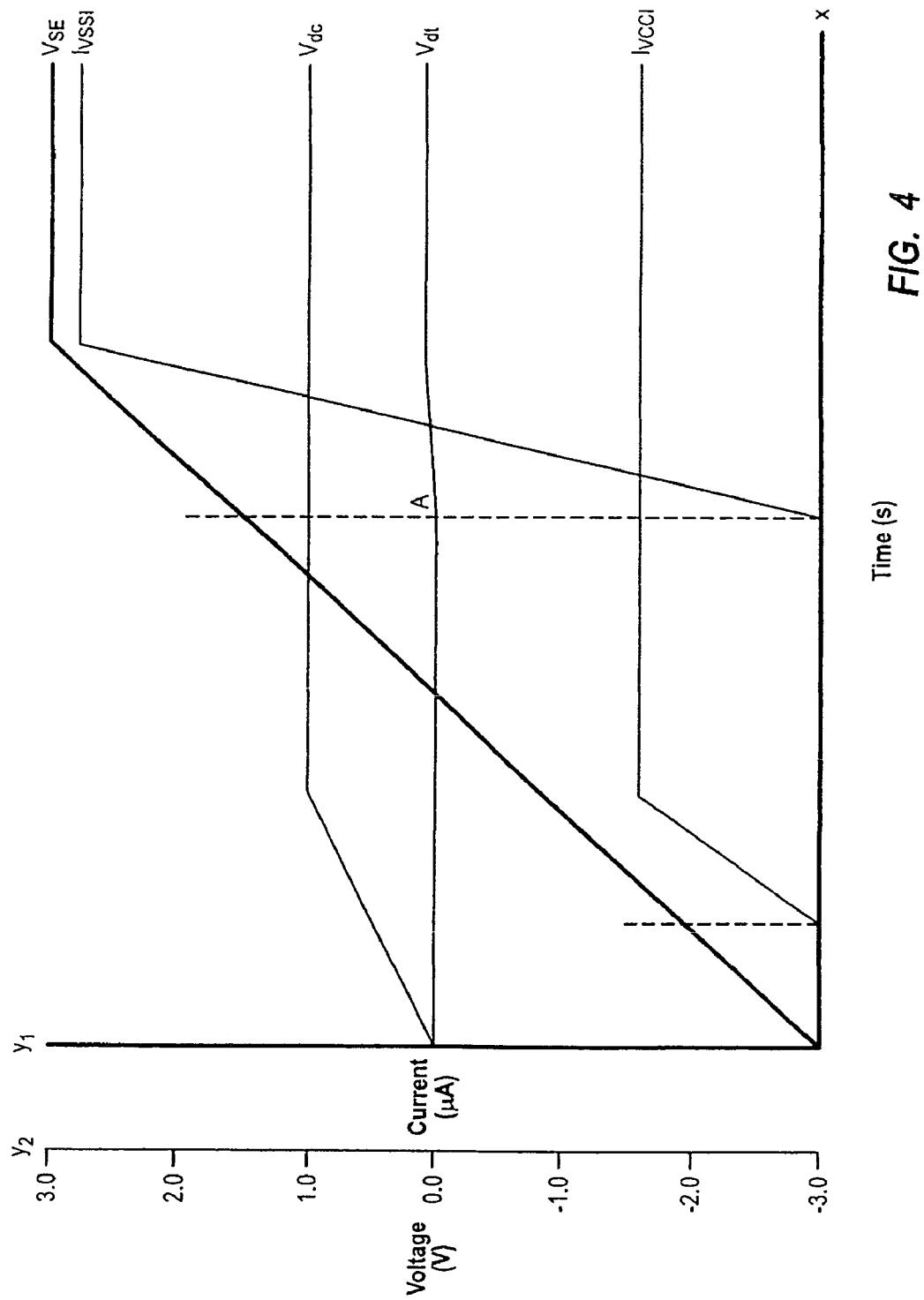
FIG. 4 is a graph to visually illustrate the simulation data of an SRAM bit cell using the current sense of the SONOS $V_T$ window.

In operation, $V_{SE}$ is ramped from a beginning voltage of approximately −3.0V to an ending voltage of approximately 3.0V. It should be appreciated that the starting voltage and ending voltage for $V_{SE}$ may be more or less depending upon the device characteristics, and the illustrated values are for explanation only and should not be taken as limiting in any way. As $V_{SE}$ is ramped from a starting voltage of −3.0V, at a certain point, the Erase side of the tri-gate turns on and current begins to flow out of the tri-gate 140 in the non-volatile portion 101 to the volatile portion 102. The dc node 180 is pulled up to a voltage of approximately 1.8V, which is sufficient to turn on transistor mndt 155 while keeping transistor mpdt 145 off. This also pulls node dt 175 close to 0V, which turns on transistor mpdc 150 and keeps transistor mndc 160 off. Current flows through current path 200 from the Erase side of the stack through $V_{CCI}$. This operation is graphically illustrated in FIG. 4, which shows the $V_{SE}$ ramping from −3.0V and $V_{dc}$ also simultaneously increasing. At a $V_{SE}$ of approximately −2.0V, current begins to flow through $V_{CCI}$, which is graphically illustrated as $I_{VCCI}$. At another point, saturation occurs and the current flowing through $V_{CCI}$ is at its maximum and no longer increases.

As $V_{SE}$ is ramped further, at a certain voltage, the tri-gate 135 in the Program side of the memory cell 100 turns on and current flows through current path 205 from the Program side through $V_{SSI}$. As a result, $V_{dt}$ increases slightly as well. This operation is also graphically illustrated in FIG. 4. $V_{SE}$ ramps until it hits approximately 1.4V. At that point, the tri-gate 135 on the Program side of the stack turns on and current begins to flow through current path 205 through dt node 175 through the transistor mndt 155 and into $V_{SSI}$. The current flowing in current path 205 is graphically illustrated in FIG. 4 as $I_{VSSI}$. $I_{VSSI}$ increases until $V_{SE}$ is at its maximum. As shown $V_{dt}$ also increases slightly until $V_{SE}$ hits its maximum.

Figure 3A:
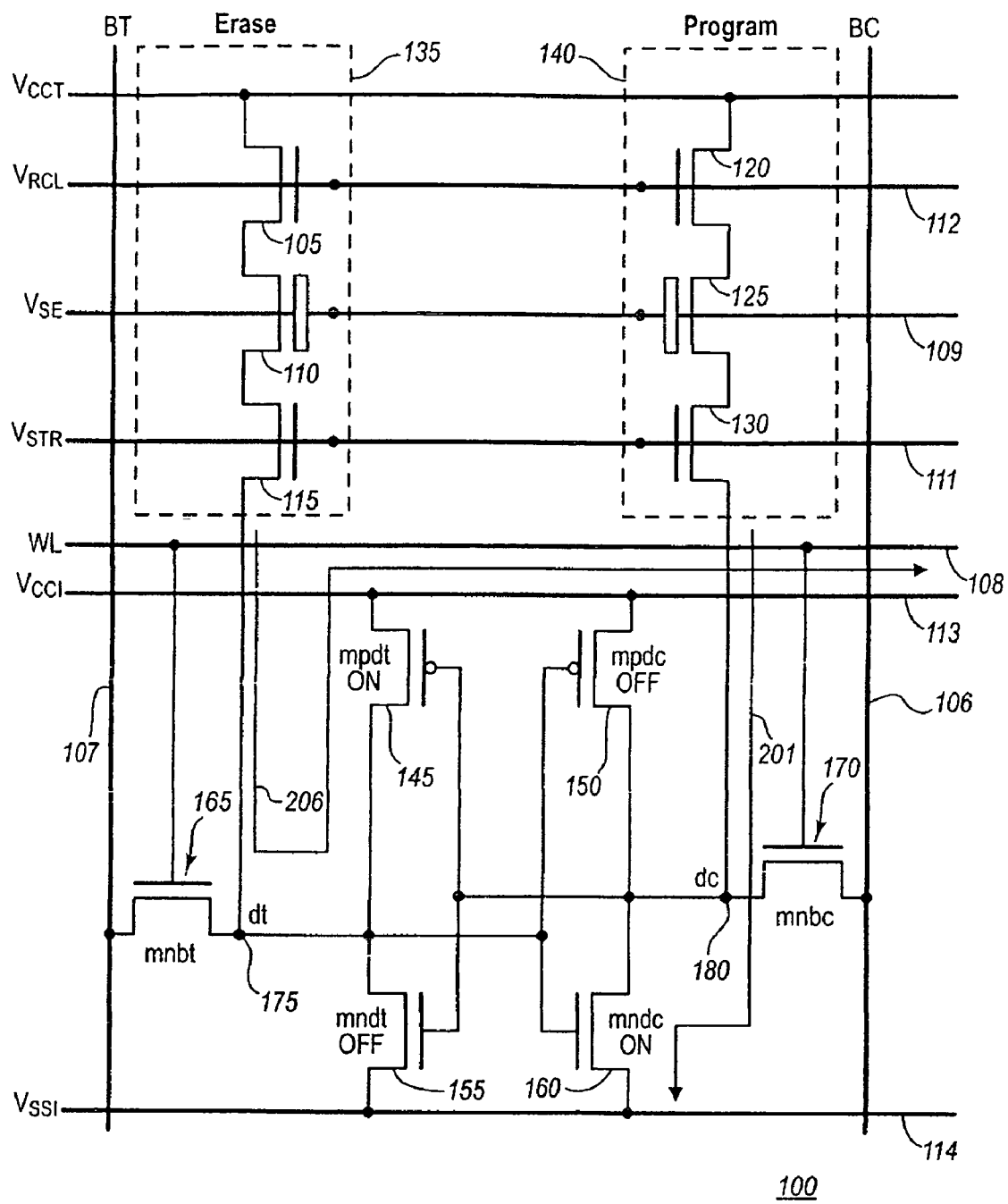
FIG. 3A is a schematic diagram illustrating two current paths for measuring the $V_T$ window for the SONOS transistors where the right portion is the Program side and the left portion is the ERASE side.

At the threshold voltage of an erase, $V_{Te}$, current begins to flow along a first current path 200 that is established from the Erase portion of the memory cell 100 that flows from supply voltage $V_{CCT}$ 116 through the tri-gate 140 to node dc 180 through transistor mpdc 150 out through $V_{CCI}$. As described, as $V_{SE}$ increases, at the threshold voltage of a program $V_{Tp}$, current begins to flow along a second current path is established from the Program portion of the memory cell 100 that flows from supply voltage $V_{CCT}$ 116 through the tri-gate 135 to node dt 175 through transistor 155 out through $V_{SSI}$. The determination of the two threshold voltages, $V_{Tp}$ and $V_{Te}$ provides the VT window of the SONOS transistors in memory cell 100. The Program and Erase sides of the stack may be flipped, as shown in FIG. 3A, and therefore the $V_{Tp}$ and $V_{Te}$ of the opposite SONOS cells 110, 125 may be determined using current paths 201 and 206 providing a more accurate estimation of the $V_T$ window.

It should be appreciated that current may be measured at any point along first path 200 or second path 205, but is ideally measured at nodes dc 180 and dt 175. It should also be appreciated that in an on chip operation, $V_{CCI}$ and $V_{SSI}$ are not shorted together, but current will flow and therefore may be measured separately in either path.

Figure 5:
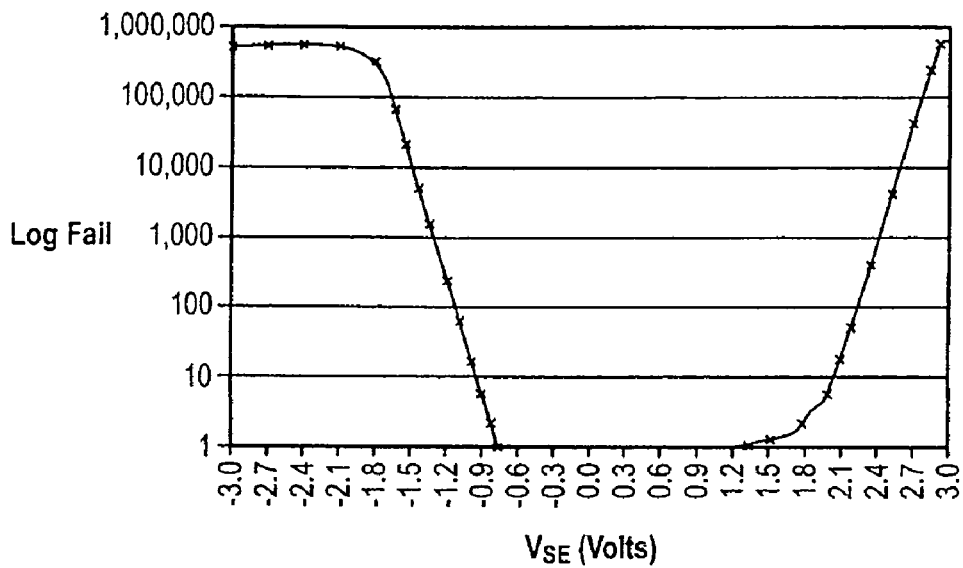
FIG. 5 is a graph illustrating the margin mode method of determining the $V_T$ window of a SONOS transistor.

The previous method for determining the $V_T$ window is known as a margin mode. The results of a typical margin mode operation are illustrated in FIG. 5. As shown, the margin mode results for this particular device is −0.8V $V_{Te}$, to 1.3V $V_{Tp}$ for a $V_T$ window of approximately 2.1V. For a successful RECALL operation, $V_{SE}$ was set within this window. However, as discussed previously, the $V_T$ window degrades and the chosen $V_{SE}$ for a successful RECALL in an nvSRAM may fall outside of the window thus causing a failure during the RECALL operation. The margin mode also is not performed on the chip after testing, it is a set-up test only and cannot adapt to the degradation of the $V_T$ window after a number of operations.

Figure 6:
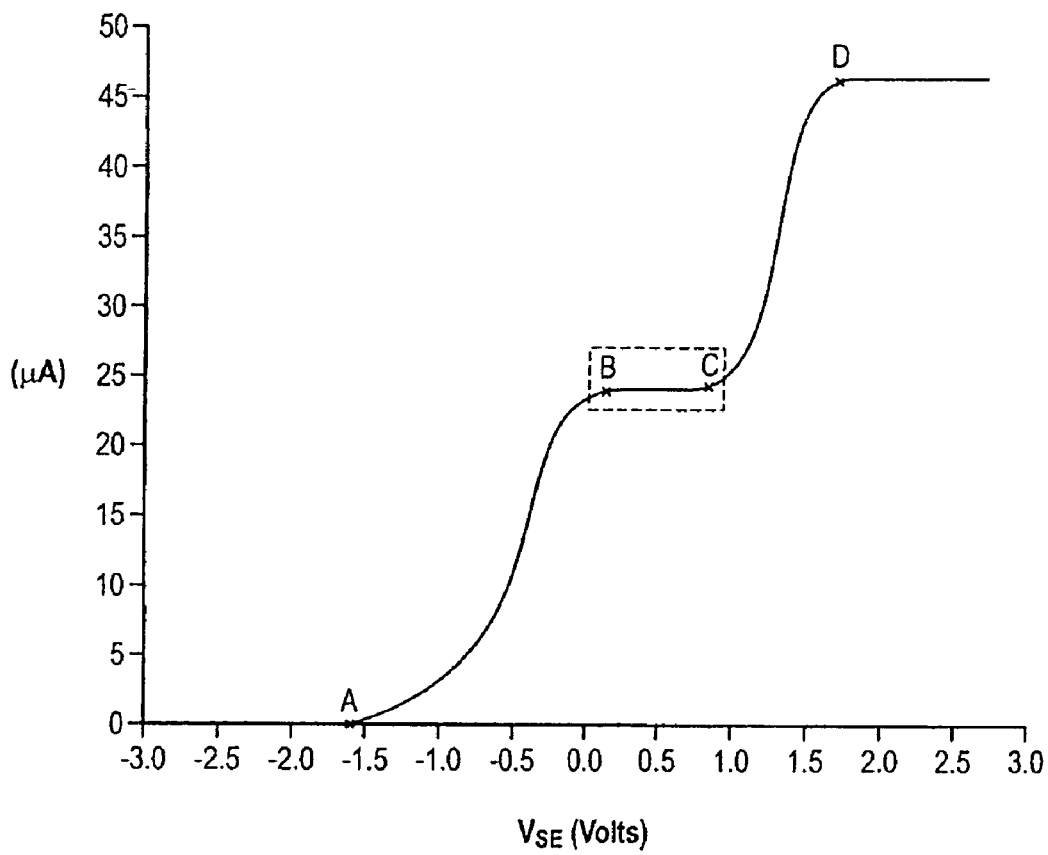
FIG. 6 is a graph illustrating the current sense of a SONOS $V_T$ window when ramping $V_{SE}$ and the resulting current measured.

FIG. 6 graphically illustrates performing a current sense operation in a number of SONOS transistors in an array. As illustrated at point A, at a $V_{SE}$ of 1.6V, current begins to flow within the erase tri-gates, which is also the approximate value of the erase threshold voltage $V_{Te}$. At point B, at approximately 0.2V, all erase tri-gates in the array are on and saturated, and all of the program tri-gates are off. Continuing with the illustrated example, at point C at a $V_{SE}$ of approximately 0.8V, current begins to flow through the program tri-gates, which is also the approximate value of the program threshold voltage $V_{Tp}$. Finally, at point D at approximately 1.7V, the erase and program tri-gates are saturated. Accordingly, the preferred value of $V_{SE}$ for a RECALL operation is chosen between point B and point C, which is between 0.2V and 0.8V in the illustrated example.

Figure 7:
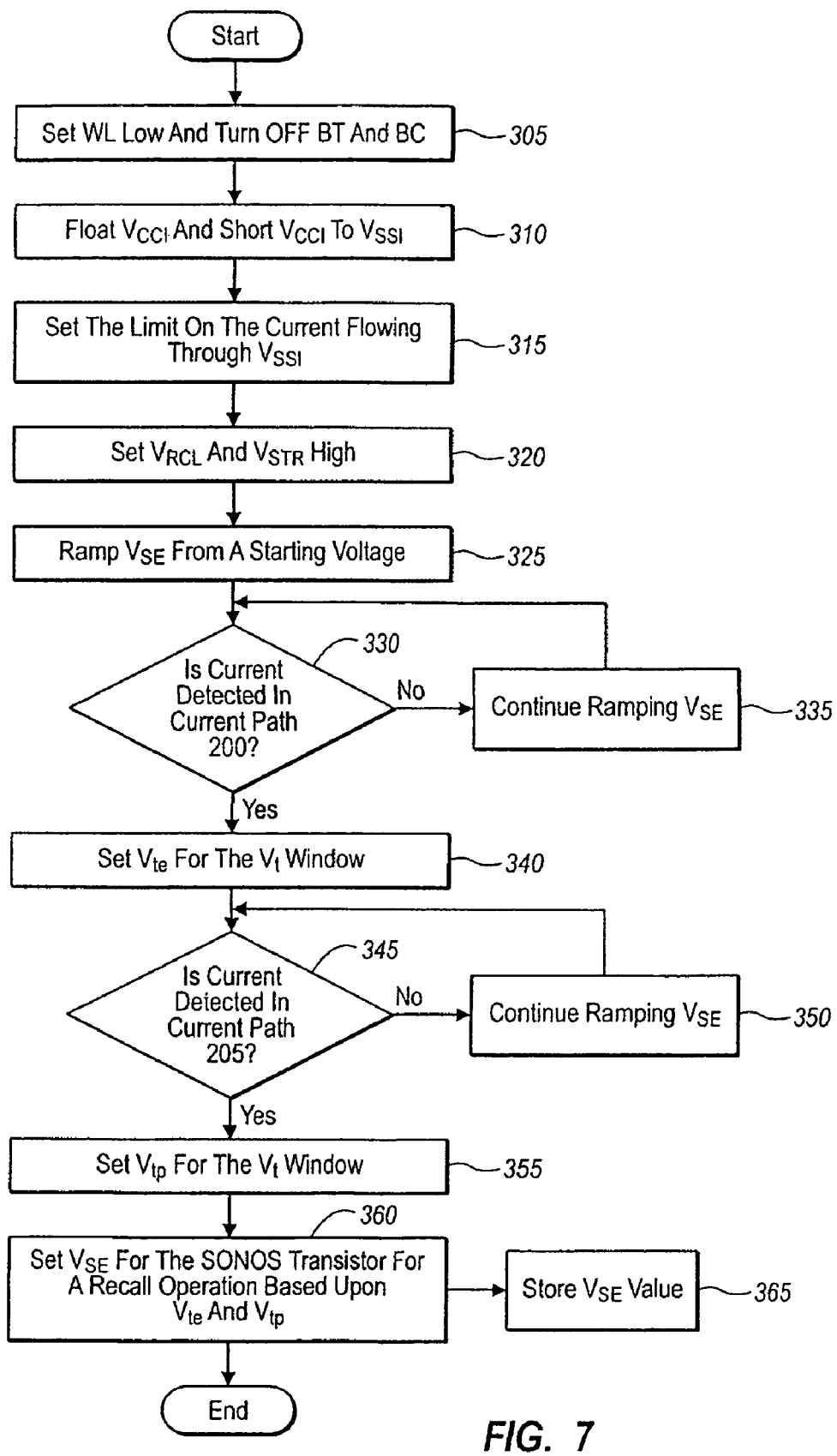
FIG. 7 is a flow chart of the method for determining the $V_T$ window of a SONOS transistor and setting the recall $V_{SE}$ accordingly.

FIG. 7 is a flow chart of the method for determining the $V_T$ window of a SONOS transistor and setting the recall $V_{SE}$ accordingly. The method illustrated in FIG. 7 may be performed in firmware of a chip, ideally before every recall operation and also at power-up or when there is a soft recall command. Referring to FIG. 7, the $V_T$ window of a SONOS transistor in a non-volatile portion of a nvSRAM illustrated in FIG. 1 is determined. As shown in block 305, the word line is drawn low to turn off the bit lines to the volatile portion of the nvSRAM. Turning off the word line, or having 0V on the word line, isolates the volatile portion of the memory cell from the non-volatile portion and ensures that the pass transistors in the volatile portion of the memory cell are not turned on, since the voltage to each of the gates will be 0V or ground.

VCCI is floated and then coupled to VSSI (chip ground), as shown in block 310. The grounding of VCCI to VSSI creates a source of voltage differential thereby allowing current to flow into each of the areas and creating potential current paths. A current limit is then set within the resulting paths of current flow, as shown in block 315. The current limiting step is not an essential step, however, it helps monitor the current flow to ensure there is no damage to other components. In step 320, the VRCL and VSTR of the transistors in the tri-gates is set to a high condition. Typically, a high or on state is 3.3V, however, this voltage may be tailored to the particular transistor used within the non-volatile tri-gate arrangement $V_{SE}$ is then ramped from its initial voltage that is clearly outside of the $V_T$ window as depicted in block 325. In one embodiment, the initial $V_{SE}$ value is −3.0V, however, that voltage is in no way the starting voltage for all designs. There is a current monitoring device at specific locations within the memory cell to detect the presence of current flowing from the first and second tri-gate of the non-volatile portion of the memory cell. At the first location, in block 330, the current sense device monitors for the current flowing from the tri-gate on the erase side of the memory cell. If current is not detected, $V_{SE}$ continues to ramp as shown in block 335. Once current is detected at the current monitoring device, the erase threshold voltage $V_{Te}$ for the SONOS transistor is determined in block 340.

$V_{SE}$ continues to ramp, in block 350, until current is detected flowing from the tri-gate of the program side of the memory cell, as shown in block 345. Once current is detected flowing from the tri-gate of the program side of the memory cell in block 345, the voltage threshold $V_{Tp}$ for the SONOS transistor on the program side is determined in block 355. The values of $V_{Tp}$ and $V_{Te}$ give the $V_T$ window of the SONOS transistor. The appropriate $V_{SE}$ for a successful RECALL operation may be then set based upon the calculated $V_T$ window in block 360. The value of $V_{SE}$ may also be stored for later retrieval in block 365.

While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

We claim:

1. A method for determining a SONOS $V_T$ window in a non-volatile SRAM having a volatile portion and a non-volatile portion, said method comprising:
    creating a first current path from a first tri-gate structure to a first location, said first tri-gate structure having a first recall transistor, a first store transistor and a first SONOS transistor, each transistor having a gate node, a source node and a drain node, said first current path including a first data node within said volatile portion, said first location having a current monitoring means for detecting current on said first current path;
    creating a second current path from a second tri-gate structure to a second location, said second tri-gate structure having a second recall transistor, a second store transistor and second SONOS transistor, each transistor having a gate node, a source node and a drain node, said second current path including a second data node within said volatile portion, said second location having a current monitoring means for detecting current on said second current path;
    ramping a voltage applied to said gate nodes of said first and second SONOS transistors;
    detecting current on said first current path to determine an erase threshold voltage;
    detecting the presence of current on said second current path to determine the program threshold voltage; and
    determining the $V_T$ window of said first and second SONOS transistors based upon said erase threshold voltage and said program threshold voltage.

2. The method of claim 1 further comprising:
    setting a first voltage to an on state that is applied to said gate nodes of said first recall transistor and said second recall transistor; and setting a second voltage to an on state that is applied to said gate nodes of said first store transistor and said second store transistor.

3. The method of claim 1 further comprising:
setting a word line to ground that is coupled to said volatile portion of said non-volatile SRAM.

4. The method of claim 1 wherein said current monitoring means for detecting current on said first current path includes a current monitoring device, and
wherein said current monitoring means for detecting current on said second current path includes a current monitoring device.

5. A method for determining a voltage to apply to the gate nodes of a plurality of SONOS transistors for a RECALL operation within a non-volatile SRAM having a volatile portion and a non-volatile portion, said method comprising:
creating a first current path from each erase tri-gate structure in said non-volatile portion to a first location, said erase tri-gate structure having a recall transistor, a store transistor and a SONOS transistor, said first current path including a data node within said volatile portion, said first location having a current monitoring device for detecting current on said first current path;
creating a second current path from each program tri-gate structure in said non-volatile portion to a second location, said program tri-gate structure having a recall transistor, a store transistor and a SONOS transistor, said second current path including a second data node within said volatile portion, said second location having a current monitoring device for detecting current on said second current path;
ramping a voltage applied to said gate nodes of each SONOS transistors from an initial voltage to a terminating voltage;
detecting current on said first current path to determine an erase threshold voltage;
detecting a range of voltages where current in said first current path does not increase when said voltage applied to said SONOS transistor is ramped;
detecting current within said second current path to determine a program threshold voltage; and
setting said voltage to apply to said gate nodes of said plurality of SONOS transistors between said erase threshold voltage and said program threshold voltage.

6. The method of claim 5 further comprising:
setting a first voltage to an on state that is applied to said recall transistor of said erase tri-gate structure and to said recall transistor of said program tri-gate structure; and
setting a second voltage to an on state that is applied to said store transistor of said erase tri-gate structure and to said store transistor of said program tri-gate structure.

7. The method of claim 5 further comprising:
setting a word line to ground that is coupled to said volatile portion of said non-volatile SRAM.

\* \* \* \* \*